United States Patent [19]

Rice

[11] 4,419,811

[45] Dec. 13, 1983

[54] METHOD OF FABRICATING MESA MOSFET USING OVERHANG MASK

[75] Inventor: Edward J. Rice, Los Gatos, Calif.

[73] Assignee: Acrian, Inc., Los Gatos, Calif.

[21] Appl. No.: 371,599

[22] Filed: Apr. 26, 1982

[51] Int. Cl.³ .............................................. H01L 21/22
[52] U.S. Cl. ................................... 29/571; 29/578; 29/579; 29/580; 29/591; 148/187
[58] Field of Search ................ 29/571, 578, 579, 580, 29/591; 148/187; 357/23 VD, 55

[56] References Cited

U.S. PATENT DOCUMENTS

| | | | |
|---|---|---|---|
| 3,823,352 | 7/1974 | Pruniaux et al. | 29/579 |
| 3,851,379 | 12/1974 | Gutknecht et al. | 29/571 |
| 3,938,241 | 2/1976 | George et al. | 29/580 X |
| 4,200,968 | 5/1980 | Schroeder | 29/571 |
| 4,374,455 | 2/1983 | Goodman | 29/578 X |
| 4,375,124 | 3/1983 | Cogan | 148/187 X |

*Primary Examiner*—George T. Ozaki
*Attorney, Agent, or Firm*—Flehr, Hohbach, Test, Albritton & Herbert

[57] ABSTRACT

A mesa structure field effect transistor includes a semiconductor body with at least one mesa formed on a major surface and an insulating layer on the mesa and overhanging the mesa. Doped regions in the side walls of the mesa define the channel region and source of the transistor, and the semiconductor body defines the drain region. Preferential etching techniques are employed in forming the mesas and the overhanging insulator. The overhanging insulator is employed as a shadow mask in fabricating the transistor.

4 Claims, 17 Drawing Figures

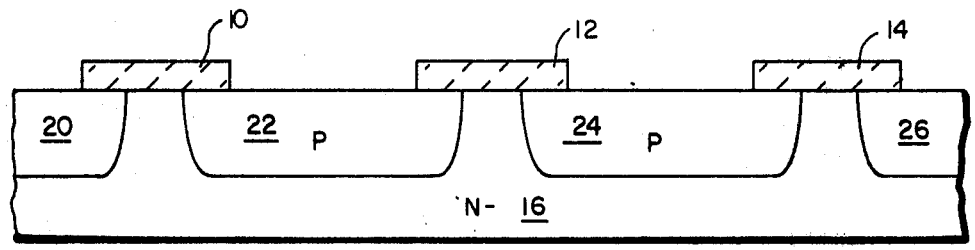
FIG.—1A
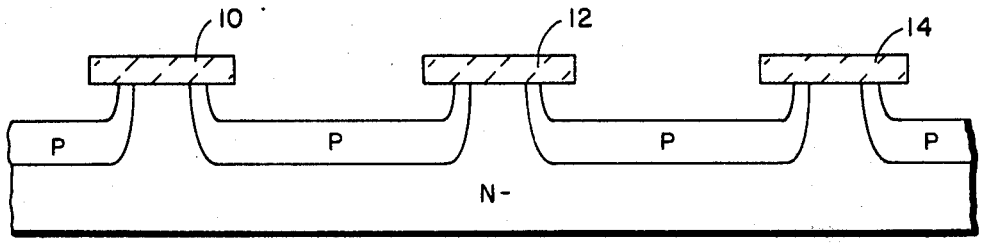
FIG.—1B
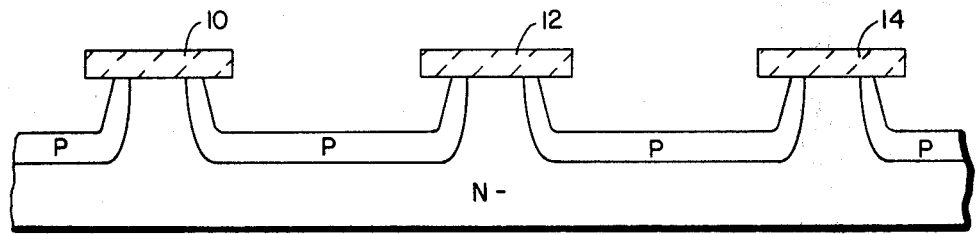
FIG.—1C
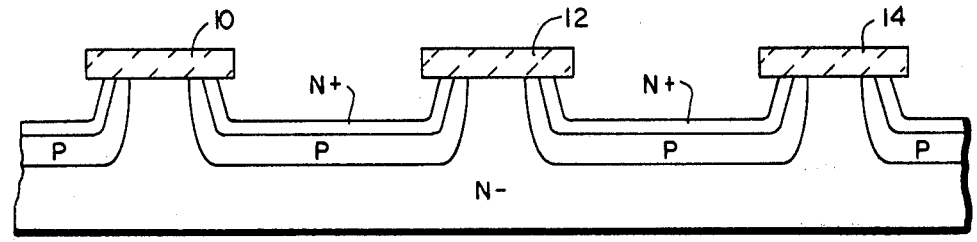
FIG.—1D
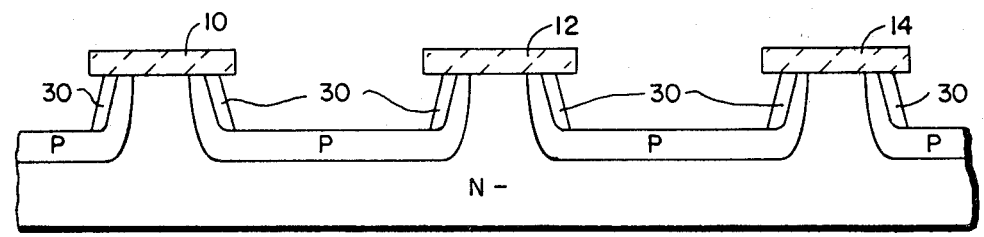
FIG.—1E

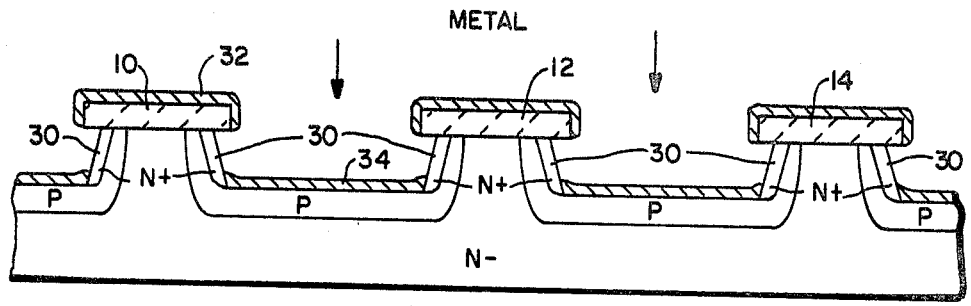
FIG.—IF
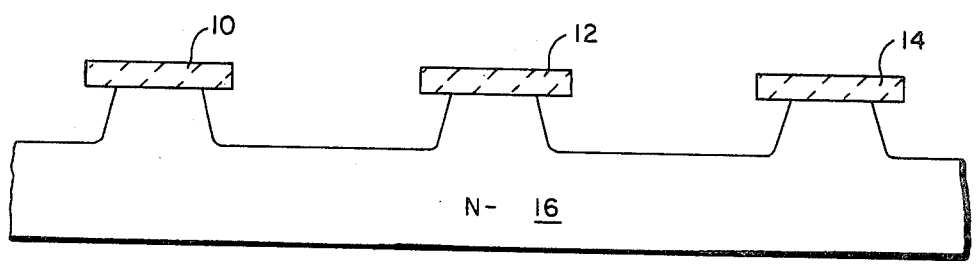
FIG.—2A
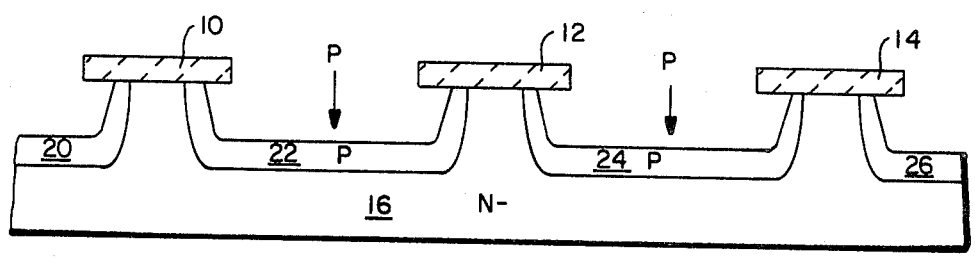
FIG.—2B
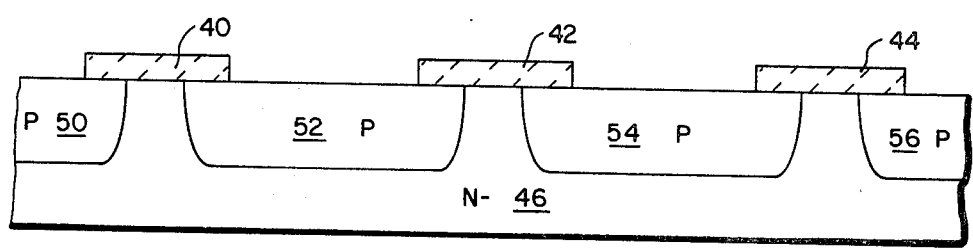
FIG.—3A

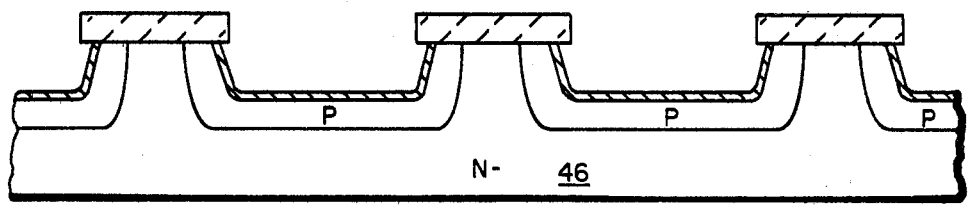
FIG.—3B
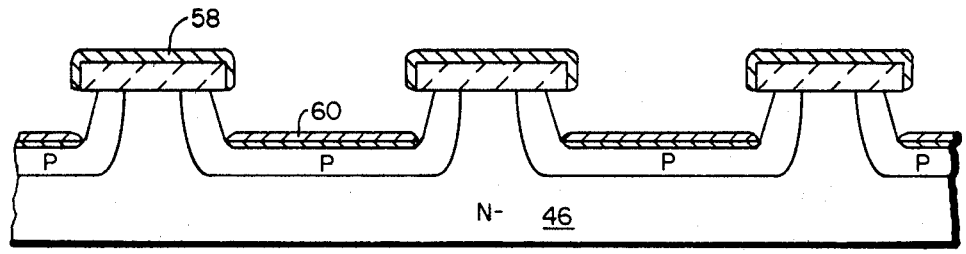
FIG.—3C
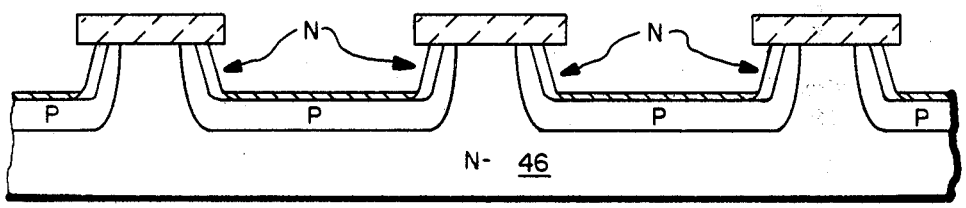
FIG.—3D
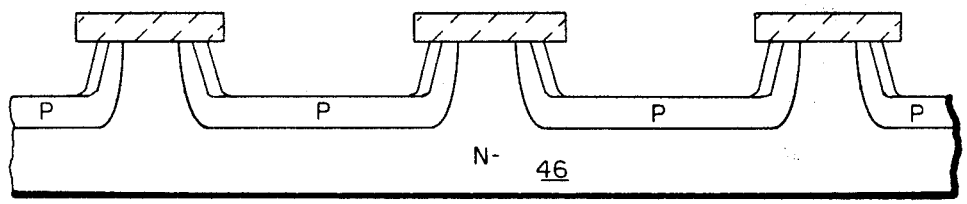
FIG.—3E

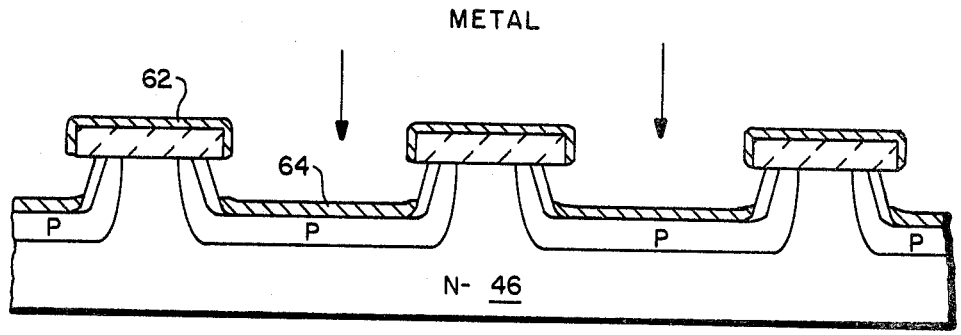
FIG.—3F
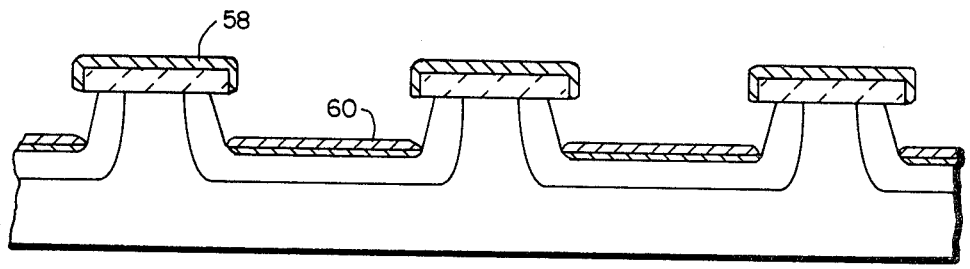
FIG.—4A
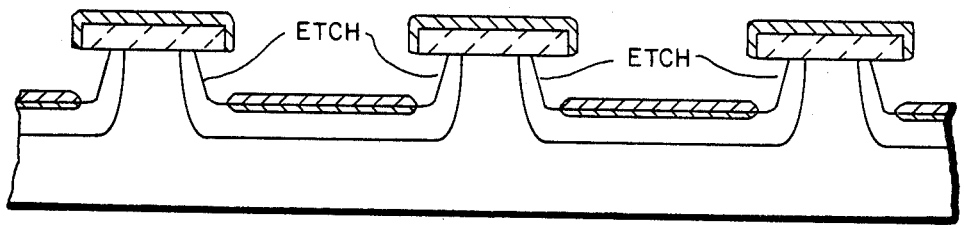
FIG.—4B
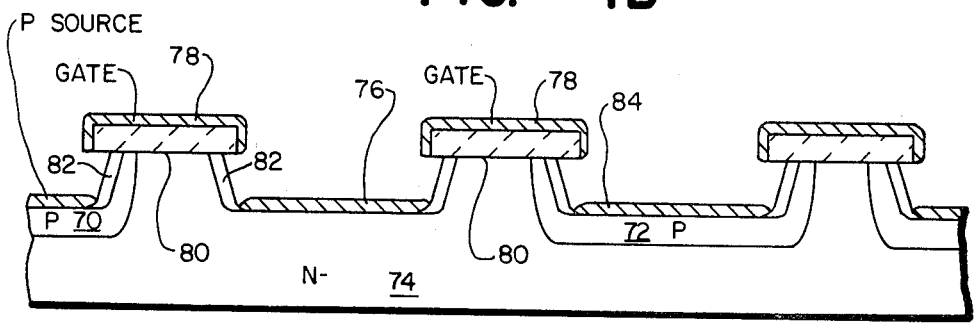
FIG.—5

METHOD OF FABRICATING MESA MOSFET USING OVERHANG MASK

This invention relates generally to semiconductor devices and processes, and more particularly the invention relates to metal oxide silicon field effect transistor (MOSFET) structures and methods of fabricating same.

Vertical and horizontal MOSFET structures are well known in the art. The vertical structure is particularly advantageous in high frequency applications because of small channel lengths which can be obtained. The use of isotropic and anisotropic (preferential) etching techniques, along with the use of oxide overhang masking, are well known, also.

The present invention is directed to a method of making novel MOSFET structures using a unique combination of known processing techniques. Briefly, mesa structures having oxide overhangs are provided with the overhanging portion functioning as a mask in the processing steps. A vertical MOSFET formed in the mesa structure has a short, controlled channel region which is advantageous for high frequency applications.

The invention and objects and features thereof will be more readily apparent from the following detailed description and appended claims when taken with the drawing, in which:

FIGS. 1A–1F are section views of a portion of a semiconductor body illustrating the steps in fabricating a MOSFET structure in accordance with one embodiment of the invention.

FIGS. 2A and 2B are section views of a portion of a semiconductor body illustrating alternative steps in the process illustrated in FIGS. 1A–1F.

FIGS. 3A–3F are section views of a portion of a semiconductor body illustrating the steps in fabricating a MOSFET structure in accordance with another embodiment of the invention.

FIGS. 4A and 4B are section views of a portion of a semiconductor body illustrating alternative steps in the process illustrated in FIGS. 3A–3F.

FIG. 5 is a section view of a portion of a semiconductor body illustrating a MOSFET structure in accordance with another embodiment of the invention.

Referring now to the drawings, FIGS. 1A–1F are section views of a portion of a portion of a semiconductor body illustrating the steps in fabricating a MOSFET structure in accordance with one embodiment of the invention. In the process descriptions herein the steps in fabricating an N channel enhancement mode device will be described. However, it will be appreciated that the process steps can be used to make other field effect transistor structures including P channel and depletion mode structures. In FIG. 1A a plurality of insulating layers 10, 12 and 14 are formed on a major surface of an N− silicon body 16. The insulating layer may comprise a silicon oxide layer or silicon oxide and silicon nitride layers. The surface has a 1-0-0 crystal structure which allows anisotropic or preferential etching as will be described. The body 16 may comprise a semiconductor substrate or an epitaxial layer on a silicon substrate. The insulating layers 10, 12, 14 are utilized as a mask in diffusing a P type dopant such as boron into the major surface of the body 16 thereby forming the P doped regions 20, 22, 24 and 26.

Thereafter, as illustrated in FIG. 1B the exposed surface of body 16 between the insulating layers 10, 12, 14 is etched by an isotropic etch such as a mixture of hydrofluoric and nitric acid. The isotropic etch undercuts the insulating layers 10, 12, 14 and forms mesa structures thereunder.

Next, an anisotropic etchant such as potassium hydroxide is applied which preferentially attacks the 1-0-0 plane of the silicon surface thereby deepening the etched portion of the P regions 20-26 and forming generally planar inclined side walls on the mesas which are defined by the 1-1-1 crystalline plane of the silicon material.

Following the preferential etch, a shallow N+ diffusion is made through the silicon oxide layers 10-14 into the surface of the P regions 20-26 as illustrated in FIG. 1D. Thereafter, a preferential etchant is again applied to the exposed semiconductor material thereby removing the shallow N+ region in the 1-0-0 plane but leaving the N+ regions 30 in the 1-1-1 crystallographic planes of the sidewalls of the mesas intact as shown in FIG. 1E.

Finally, as illustrated in FIG. 1F, a conductive metal such as aluminum is deposited on the surface of the silicon body. The insulating layers 10-14 function as shadow masks and interrupt the metal layers 32 deposited on top of the insulating layers from the metal layers 34 formed on the surface of the P regions 20-26. The completed structure comprises the N− body 16 as a common drain region, the N+ regions 30 as a source region, and the P doped regions 20-26 immediately beneath the insulating layers 10-14 comprise the channel regions of the devices. Metal layers 32 are gate contacts, and metal layers 34 are common source-channel region contacts. Importantly, the length of the channel region is short and well defined by the N+ diffusion into the sidewall of the mesa. Further, the metal layers 34 short the source and channel regions very close to the channel thereby suppressing any parasitic NPN transistor function.

An alternative embodiment of the process described in FIGS. 1A–1F is illustrated in FIGS. 2A and 2B in which the isotropic and anisotropic etch of the semiconductor body 16 is performed as shown in FIG. 2A prior to the diffusion of P dopant to form the regions 20, 22, 24 and 26 as shown in FIG. 2B.

FIGS. 3A–3F are section views of a semiconductor body illustrating steps in fabricating a device in accordance with another embodiment of the invention. Again, as shown in FIG. 3A insulating layers 40, 42, and 44 are formed on a 1-0-0 major surface of an N− semiconductor body 46, and P doped regions 50, 52, 54 and 56 are formed in the major surface of the body 46.

Thereafter, as illustrated in FIG. 3B the P regions 50–56 are isotropically etched thereby undercutting the insulating layers 40–44, and the exposed surface of the etched regions is oxidized as shown in FIG. 3B.

Next, as shown in FIG. 3C a layer 58 and 60 of masking material such as aluminum are deposited on the major surface of the body 46 with the overhanging insulation providing a mask which shields the masking material from the side walls of the mesas. The exposed silicon oxide on the side walls is then removed by an etchant and the masking material is then removed.

Thereafter, as shown in FIG. 3D N type regions are diffused into the exposed sidewalls of the mesas, with the oxide on the bottom masking that area from the N+ diffusion. Subsequently, the remaining silicon oxide layers on the surfaces of the P regions 50-56 are removed by etching (which also removes a small portion of the thicker silicon oxide layers 40–44) as illustrated in FIG. 3E.

Finally, as shown in FIG. 3F conductive metallization is again deposited on the major surface of the body 46 with the metal layers 62 on the surfaces of the insulating layers 40–44 being separated from the metal layers 64 on the surfaces of the P regions 50–56 by the shadow mask provided by the overhanging insulating layers. The structure as shown in FIG. 3F is the same as the structure shown in FIG. 1F.

FIGS. 4A and 4B illustrate additional steps which can be performed between the steps 3C and 3D. FIG. 4A illustrates the structure of FIG. 3C with the masking material layer 58 on the top of the insulating layers 40–44 and the masking material layer 60 on top of the P regions 50–56. As shown in FIG. 4B an isotropic etch is applied to the exposed sidewalls of the mesa beneath the insulating layers 40–44 thereby further reducing the thickness of the channel regions defined by the P type regions underneath the insulating layers. The masking material layers can be removed prior to or after the isotropic etch. This process variation has the advantage in that the final surface concentration of the P channel region can be controlled by monitoring the sheet resistance of test wafers as the sidewalls of the mesas are isotropically etched. Thereafter, the N type regions are formed in the exposed mesa sidewalls as illustrated in FIG. 3D.

The resulting structures in the described processes are vertical MOSFETs as illustrated in FIGS. 1F and 3F. However, the process steps can be varied slightly to form a lateral MOSFET as illustrated in FIG. 5. In this embodiment it will be noted that the diffused P regions 70 and 72 formed in the N-semiconductor body 74 are separated by an etched region having no P region. Metal layer 76 is a drain contact to the N− body and an N+ channel portion 82, the metal 78 on the insulating layers 80 form the gate contacts, and the metal layers 84 are source-channel region contacts. The gate contact 78 controls channel regions in the underlying N+ regions 82. Thus, the current flow is lateral from the source contact 84 through the induced channels in N+ regions 82 to the drain contact 76.

In illustrative embodiments the N− body is an epitaxial layer having a dopant concentration of $10^{14}$–$10^{16}$ phosphorus atoms per cc. The P− region has a surface concentration of $6 \times 10^{16}$ boron atoms per cc, and the N+ regions have a dopant concentration of $3 \times 10^{19}$ phosphorus atoms per cc. The isotropic etch and the anisotropic etch each removed one to two microns of semiconductor material.

There has been described a MOSFET transistor structure in which the channel regions are narrow and closely controlled for enhanced operation characteristics. Further, the common contact to the source and channel regions is provided close to the induced channel thereby suppressing any parasitic bipolar transistor action. The shadow masks provided by the overhanging silicon oxide layers above the mesas interrupt the metal layers on top of the mesas (gate contacts) and the metal layers on the surface of the recessed etched regions (source and drain contacts).

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of fabricating a field effect transistor in a body of semiconductor material of first conductivity type comprising the steps of
   (a) forming a plurality of spaced layers of insulating material on a major surface of said body constituting a common drain region,
   (b) forming regions of opposite conductivity type in said major surface by introducing dopants into exposed portions of said major surface of said semiconductor body,
   (c) removing a portion of said region of opposite conductivity by chemical etching thereby forming mesa structures with said spaced layers of insulating material overhanging said mesas,
   (d) diffusing a dopant of said first conductivity type into the etched surface of said regions of opposite conductivity type,
   (e) applying a preferential etchant to said etched surface thereby removing said dopant of said first conductivity type except in the side walls of said mesas to form source regions, and
   (f) forming conductive metal layers on said plurality of spaced layers to form gate electrodes and conductive layers on said etched surfaces to form source electrodes, said spaced layers overhanging said mesas interrupting said conductive metal layers on said spaced layers from said conductive layers on said etched surface.

2. A method of fabricating a field effect transistor in a body of semiconductor material of first conductivity type comprising the steps of
   (a) forming a plurality of spaced layers of insulating material on a major surface of said body constituting a common drain region,
   (b) removing at least a portion of said major surface of said semiconductor body by chemical etching thereby forming mesa structures on said major surface with said spaced layers of insulating material overhanging said mesas,
   (c) forming regions of opposite conductivity in said major surface by introducing dopants into the etched portions of said major surface,
   (d) diffusing a dopant of said first conductivity type into the etched surface of said regions of opposite conductivity type,
   (e) applying a preferential etchant to said etched surfaces thereby removing said dopant of said first conductivity type except in the side walls of said mesas to form source regions, and
   (f) forming conductive metal layers on said plurality of spaced layers to form gate electrodes and conductive layers on said etched surfaces to form source electrodes, said spaced layers overhanging said mesas interrupting said conductive metal layers on said spaced layers from said conductive layers on said etched surfaces.

3. A method of fabricating a field effect transistor in a body of semiconductor material of first conductivity type comprising the steps of
   (a) forming a plurality of spaced layers of insulating material on a major surface of said body constituting a common drain region,
   (b) forming regions of opposite conductivity type in said major surface by introducing dopants into exposed portions of said major surface of said semiconductor body,
   (c) removing a portion of said regions of opposite conductivity by chemical etching thereby forming mesa structures with said spaced layers of insulating material overhanging said mesas, (d) oxidizing the etched surfaces of said semiconductor body, thereby forming silicon oxide layers, (e) depositing masking material layers on said plurality of spaced layers and on said etched surfaces, said spaced layers overhanging said mesas interrupting said masking material layer on said spaced layers from said layers on said etched surface, (f) removing the silicon oxide on the side walls of said mesa not covered by said masking material layer under said overhanging spaced layers, (g) removing said masking material layers, (h) diffusing a first conductivity type dopant into the exposed surfaces of said mesa side walls to form source regions, (i) removing said silicon oxide layers from said etched regions, and (j) forming conductive metal layers on said plurality of spaced layers to form gate electrodes and conductive layers on said etched surfaces to form source electrodes, said spaced layers overhanging said mesas interrupting said conductive metal layers on said spaced layers from said conductive metal layers on said etched surface.

4. The method of fabricating a field effect transistor as defined by claim 3 and further including the step of etching the exposed side wall surfaces following step (f) and before step (g).

* * * * *